（12） United States Patent
Masuda et al.

(10) Patent No.: US 10,259,997 B2
(45) Date of Patent: Apr. 16, 2019

(54) PHOSPHOR, METHOD OF PRODUCING THE SAME, AND LIGHT EMITTING APPARATUS

(71) Applicant: GE Phosphors Technology, LLC, Niskayuna, NY (US)

(72) Inventors: Masatsugu Masuda, Osaka (JP); Kenji Terashima, Osaka (JP)

(73) Assignee: GE PHOSPHORS TECHNOLOGY, LLC, Niskayuna, NY (US)

( * ) Notice: Subject to any disclaimer, the term of this patent is extended or adjusted under 35 U.S.C. 154(b) by 0 days.

(21) Appl. No.: 15/788,302

(22) Filed: Oct. 19, 2017

(65) Prior Publication Data

US 2018/0044587 A1 Feb. 15, 2018

Related U.S. Application Data

(60) Division of application No. 15/371,747, filed on Dec. 7, 2016, now Pat. No. 9,884,990, which is a
(Continued)

(30) Foreign Application Priority Data

Nov. 24, 2006 (JP) .................................. 2006-317524

(51) Int. Cl.
*C09K 11/77* (2006.01)
*B82Y 30/00* (2011.01)
(Continued)

(52) U.S. Cl.
CPC .......... *C09K 11/7728* (2013.01); *B82Y 30/00* (2013.01); *C01B 21/0602* (2013.01);
(Continued)

(58) Field of Classification Search
CPC .................................................. C09K 11/7728
(Continued)

(56) References Cited

U.S. PATENT DOCUMENTS 3,707,641 A 12/1972 Thornton
4,216,408 A 8/1980 Verstegen et al.
(Continued)

FOREIGN PATENT DOCUMENTS

CN 1129727 8/1996
CN 1289455 3/2001
(Continued)

OTHER PUBLICATIONS

Xie. Optical Properties of Eu2+ in r-SiAlON.J. Phys. Chem. B 2004, 108, 12027-12031.*
(Continued)

*Primary Examiner* — Matthew E. Hoban
(74) *Attorney, Agent, or Firm* — Meagher Emanuel Laks Goldberg & Liao, LLP

(57) ABSTRACT

There are provided a phosphor which is a divalent europium-activated oxynitride phosphor substantially represented by General formula (A): $Eu_aSi_bAl_cO_dN_e$, a divalent europium-activated oxynitride phosphor substantially represented by General formula (B): $MI_fEu_gSi_hAl_kO_mN_n$ or a divalent europium-activated nitride phosphor substantially represented by General formula (C): $(MII_{1-p}Eu_p)MIIISiN_3$, having a reflectance of light emission in a longer wavelength region of visible light than a peak wavelength of 95% or larger, and a method of producing such phosphor; a nitride phosphor and an oxynitride phosphor which emit light efficiently and stably by the light having a wavelength ranging from 430 to 480 nm from a semiconductor light emitting device by means of a light emitting apparatus using such phosphor, and a producing method of such phosphor;
(Continued)

and a light emitting apparatus having stable characteristics and realizing high efficiency.

9 Claims, 1 Drawing Sheet

Related U.S. Application Data continuation of application No. 14/166,231, filed on Jan. 28, 2014, now Pat. No. 9,624,427, which is a division of application No. 11/944,052, filed on Nov. 21, 2007, now Pat. No. 8,663,498.

(51) Int. Cl.

| | |
|---|---|
| *C01B 21/06* | (2006.01) |
| *C01B 21/082* | (2006.01) |
| *C04B 35/581* | (2006.01) |
| *C04B 35/584* | (2006.01) |
| *C04B 35/597* | (2006.01) |
| *C04B 35/626* | (2006.01) |
| *C04B 35/628* | (2006.01) |
| *C09K 11/08* | (2006.01) |
| *F21K 9/64* | (2016.01) |
| *H01L 33/32* | (2010.01) |
| *H01L 33/50* | (2010.01) |
| *G02F 1/13357* | (2006.01) |

(52) U.S. Cl.
CPC ...... *C01B 21/0821* (2013.01); *C01B 21/0826* (2013.01); *C04B 35/581* (2013.01); *C04B 35/584* (2013.01); *C04B 35/597* (2013.01); *C04B 35/6262* (2013.01); *C04B 35/62807* (2013.01); *C09K 11/0883* (2013.01); *C09K 11/7734* (2013.01); *F21K 9/64* (2016.08); *H01L 33/32* (2013.01); *H01L 33/502* (2013.01); *H01L 33/504* (2013.01); *H01L 33/507* (2013.01); *C01P 2002/52* (2013.01); *C01P 2004/61* (2013.01); *C01P 2004/62* (2013.01); *C01P 2004/64* (2013.01); *C01P 2006/60* (2013.01); *C04B 2235/3208* (2013.01); *C04B 2235/3224* (2013.01); *C04B 2235/3418* (2013.01); *C04B 2235/3852* (2013.01); *C04B 2235/3865* (2013.01); *C04B 2235/3873* (2013.01); *C04B 2235/442* (2013.01); *C04B 2235/5454* (2013.01); *C04B 2235/766* (2013.01); *C04B 2235/767* (2013.01); *G02F 1/1336* (2013.01); *H01L 2224/48247* (2013.01); *H01L 2224/48257* (2013.01); *H01L 2224/73265* (2013.01)

(58) Field of Classification Search
USPC .................................................. 252/301.4 R
See application file for complete search history.

(56) References Cited

U.S. PATENT DOCUMENTS

| | | |
|---|---|---|
| 4,390,637 A | 6/1983 | Daiku |
| 5,611,959 A | 3/1997 | Kijima et al. |
| 5,684,359 A | 11/1997 | Yano et al. |
| 6,096,243 A | 8/2000 | Oshio et al. |
| 6,340,824 B1 | 1/2002 | Komoto et al. |
| 6,472,765 B1 | 10/2002 | Sano et al. |
| 6,565,771 B1 | 5/2003 | Ono et al. |
| 6,576,157 B2 | 6/2003 | Ono et al. |
| 6,632,379 B2 | 10/2003 | Mitomo et al. |
| 6,680,004 B2 | 1/2004 | Ono et al. |
| 6,686,691 B1 | 2/2004 | Mueller et al. |
| 6,717,353 B1 | 4/2004 | Mueller et al. |
| 6,812,500 B2 | 11/2004 | Reeh et al. |
| 7,026,755 B2 | 4/2006 | Setlur et al. |
| 7,026,756 B2 | 4/2006 | Shimizu et al. |
| 7,077,978 B2 | 7/2006 | Setlur et al. |
| 7,176,623 B2 | 2/2007 | Nitta et al. |
| 7,265,488 B2 | 9/2007 | Ng et al. |
| 7,345,317 B2 | 3/2008 | Reeh et al. |
| 7,453,195 B2 | 11/2008 | Radkov |
| 7,544,316 B2 | 6/2009 | Kortovich et al. |
| 7,737,621 B2 | 6/2010 | Masuda et al. |
| 7,808,012 B2 | 10/2010 | Masuda et al. |
| 7,815,817 B2 | 10/2010 | Hirosaki |
| 7,833,436 B2 | 11/2010 | Shimooka et al. |
| 8,084,942 B2 | 12/2011 | Hanamoto et al. |
| 8,362,685 B2 | 1/2013 | Masuda et al. |
| 8,663,498 B2 | 3/2014 | Masuda et al. |
| 8,709,283 B2 | 4/2014 | Masuda et al. |
| 9,000,664 B2 | 4/2015 | Hanamoto et al. |
| 2001/0001207 A1 | 5/2001 | Shimizu et al. |
| 2002/0039002 A1 | 4/2002 | Fukasawa et al. |
| 2002/0063301 A1 | 5/2002 | Hanamoto et al. |
| 2002/0079506 A1 | 6/2002 | Komoto et al. |
| 2002/0084745 A1 | 7/2002 | Wang et al. |
| 2002/0088985 A1 | 7/2002 | Komoto et al. |
| 2003/0030368 A1 | 2/2003 | Ellens et al. |
| 2003/0080341 A1 | 5/2003 | Sakano et al. |
| 2003/0218180 A1 | 11/2003 | Fujiwara |
| 2004/0000868 A1 | 1/2004 | Shimizu et al. |
| 2004/0012027 A1 | 1/2004 | Keller et al. |
| 2004/0056256 A1 | 3/2004 | Bokor et al. |
| 2004/0095063 A1 | 5/2004 | Murazaki et al. |
| 2004/0245532 A1 | 12/2004 | Maeda et al. |
| 2004/0251809 A1 | 12/2004 | Shimomura et al. |
| 2005/0001225 A1 | 1/2005 | Yoshimura et al. |
| 2005/0001533 A1 | 1/2005 | Huber et al. |
| 2005/0062417 A1 | 3/2005 | Okuyama et al. |
| 2005/0093442 A1 | 5/2005 | Setlur et al. |
| 2005/0156496 A1 | 7/2005 | Takashima et al. |
| 2005/0189863 A1 | 9/2005 | Nagatomi et al. |
| 2005/0200271 A1 | 9/2005 | Juestel et al. |
| 2005/0212397 A1 | 9/2005 | Murazaki et al. |
| 2006/0022573 A1 | 2/2006 | Gotoh et al. |
| 2006/0038477 A1 | 2/2006 | Tamaki et al. |
| 2006/0045832 A1 | 3/2006 | Nagatomi et al. |
| 2006/0076569 A1 | 4/2006 | Otsuka et al. |
| 2006/0169986 A1 | 8/2006 | Radkov et al. |
| 2006/0169998 A1 | 8/2006 | Radkov et al. |
| 2006/0198418 A1 | 9/2006 | Hama et al. |
| 2006/0208262 A1 | 9/2006 | Sakuma et al. |
| 2006/0226759 A1 | 10/2006 | Masuda et al. |
| 2007/0007494 A1 | 1/2007 | Hirosaki et al. |
| 2007/0012931 A1 | 1/2007 | Lee et al. |
| 2007/0029565 A1 | 2/2007 | Masuda et al. |
| 2007/0052342 A1 | 3/2007 | Masuda et al. |
| 2007/0054065 A1 | 3/2007 | Shutou |
| 2007/0108896 A1 | 5/2007 | Hirosaki |
| 2007/0114562 A1 | 5/2007 | Radkov et al. |
| 2007/0205712 A1 | 9/2007 | Radkov et al. |
| 2007/0215892 A1 | 9/2007 | Ishii et al. |
| 2007/0246732 A1* | 10/2007 | Sakuma ............... C04B 35/597 |
| | | 257/103 |
| 2007/0257596 A1 | 11/2007 | Shimomura et al. |
| 2007/0259206 A1 | 11/2007 | Oshio |
| 2008/0029720 A1 | 2/2008 | Li |
| 2008/0093979 A1 | 4/2008 | Bechtel et al. |
| 2008/0106186 A1 | 5/2008 | Ishii et al. |
| 2008/0191620 A1 | 8/2008 | Moriyama et al. |
| 2008/0231170 A1 | 9/2008 | Masato et al. |
| 2008/0258602 A1 | 10/2008 | Masuda et al. |
| 2009/0014741 A1 | 1/2009 | Masuda et al. |
| 2009/0021141 A1 | 1/2009 | Emoto et al. |
| 2009/0057611 A1 | 3/2009 | Hirosaki |
| 2009/0267484 A1 | 10/2009 | Kasakura et al. |
| 2010/0213821 A1 | 8/2010 | Masuda et al. |

(56) References Cited

U.S. PATENT DOCUMENTS

| | | | |
|---|---|---|---|
| 2012/0032578 | A1 | 2/2012 | Annen et al. |
| 2012/0305844 | A1 | 12/2012 | Emoto et al. |

FOREIGN PATENT DOCUMENTS

| | | |
|---|---|---|
| CN | 1591744 | 3/2005 |
| EP | 0 418 902 | 3/1991 |
| EP | 1 433 831 | 6/2004 |
| EP | 1 568 753 | 8/2005 |
| EP | 1 806 390 | 7/2007 |
| EP | 1 964 905 | 9/2008 |
| EP | 2574652 A2 | 4/2013 |
| JP | 49-077893 | 7/1974 |
| JP | 03-1 06988 | 5/1991 |
| JP | 10-228868 | 8/1998 |
| JP | 10-242513 | 9/1998 |
| JP | 10-277796 | 10/1998 |
| JP | 11-87770 | 3/1999 |
| JP | 2000-31531 | 1/2000 |
| JP | 2000-31532 | 1/2000 |
| JP | 2000-1 09826 | 4/2000 |
| JP | 2001-26407 | 1/2001 |
| JP | 2001-127346 | 5/2001 |
| JP | 2001-172623 | 6/2001 |
| JP | 2002-003836 | 1/2002 |
| JP | 2002-003837 | 1/2002 |
| JP | 2002-060747 | 2/2002 |
| JP | 2002-171 000 | 6/2002 |
| JP | 2002-249766 | 9/2002 |
| JP | 2002-275462 | 9/2002 |
| JP | 2002-363554 | 12/2002 |
| JP | 2003-64358 | 3/2003 |
| JP | 2003-11 0150 | 4/2003 |
| JP | 2003-121838 | 4/2003 |
| JP | 2003-124527 | 4/2003 |
| JP | 2003-249694 | 9/2003 |
| JP | 2003-321675 | 11/2003 |
| JP | 2003-347588 | 12/2003 |
| JP | 2004-55632 | 2/2004 |
| JP | 2004-071357 | 3/2004 |
| JP | 2004-155907 | 6/2004 |
| JP | 2004-161806 | 6/2004 |
| JP | 2004-161982 | 6/2004 |
| JP | 2004-179644 | 6/2004 |
| JP | 2004-182780 | 7/2004 |
| JP | 2004-186278 | 7/2004 |
| JP | 2004-210921 | 7/2004 |
| JP | 2004-287323 | 10/2004 |
| JP | 2004-327492 | 11/2004 |
| JP | 2005-3436 | 1/2005 |
| JP | 2005-93896 | 4/2005 |
| JP | 2005-109085 | 4/2005 |
| JP | 2005-239985 | 9/2005 |
| JP | 2005-244075 | 9/2005 |
| JP | 2005-255895 | 9/2005 |
| JP | 2005-272486 | 10/2005 |
| JP | 2005-277127 | 10/2005 |
| JP | 2005-298805 | 10/2005 |
| JP | 2006-16413 | 1/2006 |
| JP | 2006-49799 | 2/2006 |
| JP | 2006-057018 A | 3/2006 |
| JP | 2006-63233 | 3/2006 |
| JP | 2006-80443 | 3/2006 |
| JP | 2006-089547 | 4/2006 |
| JP | 2006-1 65266 | 6/2006 |
| JP | 2006-173498 | 6/2006 |
| JP | 2006-261512 | 9/2006 |
| JP | 2006-332269 | 12/2006 |
| JP | 2007-7045 | 1/2007 |
| JP | 2007-049114 | 2/2007 |
| JP | 2007-180483 | 7/2007 |
| JP | 2007-191680 | 8/2007 |
| JP | 2009-94199 | 4/2009 |
| JP | 2010-199400 | 9/2010 |
| WO | 00/33389 | 6/2000 |
| WO | 01/24229 | 4/2001 |
| WO | 02/059982 | 8/2002 |
| WO | 2005/103199 A | 3/2005 |
| WO | 2005/044947 | 5/2005 |
| WO | 2005/067068 | 7/2005 |
| WO | 2005/052087 | 9/2005 |
| WO | 2005/091387 | 9/2005 |
| WO | 2006/033418 A | 3/2006 |
| WO | 2006/041168 | 4/2006 |
| WO | 2006/068141 | 6/2006 |
| WO | 2006/093135 | 9/2006 |
| WO | 2006/101095 | 9/2006 |

OTHER PUBLICATIONS

English Translation of Search Report for corresponding Japanese Application No. 2006/317524 dated Sep. 21, 2011.

English Translation of Search Report for corresponding Chinese Application No. 2010102688982 dated Sep. 24, 2012.

Masuda et al., U.S. Office Action dated Dec. 16, 2015, directed to U.S. Appl. No. 14/936,037, 16 pages.

Masuda et al., U.S. Office Action dated Aug. 14, 2015, directed to U.S. Appl. No. 14/254,619, 7 pages.

Hanamoto et al., U.S. Advisory Action dated Jan. 14, 2015, directed to U.S. Appl. No. 14/176,442; 3 pages.

Hanamoto et al., U.S. Office Action dated Feb. 27, 2015, directed to U.S. Appl. No. 14/176,442; 12 paqes.

Masuda et al., U.S. Office Action dated Mar. 10, 2015, directed to U.S. Appl. No. 14/615,017; 10 paqes.

Hanamoto et al., U.S. Office Action dated Jul. 31, 2015, directed to U.S. Appl. No. 14/176,442, 12 pages.

Masuda et al., U.S. Office Action dated Sep. 22, 2014, directed to U.S. Appl. No. 14/470,153; 5 pages.

Hanamoto et al., U.S. Office Action dated Oct. 30, 2014, directed to U.S. Appl. No. 14/176,442; 7 pages.

Hanamoto et al., U.S. Office Action dated Apr. 28, 2014, directed to U.S. Appl. No. 14/176,442; 7 pages.

Hirosaki, N. et al. (2005). "Characterization and Properties of Green-Emitting 13-SiAlON:Eu2+ Powder Phosphors for White Light-Emitting Diodes," Applied Physics Letters. 86:211905-1-D 211905-3.

Shimomura, Y. et al., Extended Abstracts (2004). "Luminescent Properties of Green Phosphor Ca3Sc2Si3O12:Ce." Extended Abstracts. Proceedings of The 65th Annual Meeting for the Japan Society of Applied Physics. Sep. 2004, Tohoku Gakuin University.

Uheda, K. et al., (Feb. 15, 2006). "Luminescence Properties of a Red Phosphor, D CaA 1 SiN3:Eu2+, for White Light Emitting Diodes", Electrochemical and Solid State Letters, 9(4) H22-H25.

Uheda, K. et al. (Sep. 1, 2004). Luminescent Properties of the Red Nitride Phosphor (CaA 1 SiN3:Eu2+). Proceeding of JSAP Academic Meetings, Japan Society of Applied Physics. 1 ,6(3):1283; 2 pages.

Uheda, et al. (2004). "Red Phosphors for Warm White Light-emitting diodes," Phosphor Research Society, The 305th Meeting Technical Digest; pp. 37-47 (English Translation of Relevant Portions).

Uheda et al. (2006). "Host lattice materials in the system Ca3N2—AlN—Si3N4 for white light emitting diode", phys. sta. sol. (a). 203(11 ):2712-2717.

Xie, et al. (2004). "Eu2 +-doped-Ca-a-SiAlON: A yellow phosphor for white light-emitting diodes", Applied Physics Letters. 84(26):5404-5406.

Ziegler et al. (2008). "Silica-Coated InP/ZnS Nanocrystals as Converter Material in White LEOs," Advanced Materials 20:1-6.

Masuda et al., U.S. Office Action dated Feb. 5, 2009, directed to U.S. Appl. No. 11/442,000; 9 pages.

Masuda et al., U.S. Office Action dated Aug. 5, 2009, directed to U.S. Appl. No. 11/442,000; 14 pages.

Masuda et al., U.S. Office Action dated Oct. 2, 2009, directed to U.S. Appl. No. 11/442,000; 14 pages.

Masuda et al., U.S. Office Action dated Jul. 22, 2011, directed to U.S. Appl. No. 12/774,495; 9 pages.

(56) References Cited

OTHER PUBLICATIONS

Masuda et al., U.S. Office Action dated Jan. 30, 2012, directed to U.S. Appl. No. 12/774,495; 10 pages.
Masuda et al., U.S. Office Action dated Jun. 26, 2013, directed to U.S. Appl. No. 12/774,495; 9 pages.
Masuda et al., Notice of Allowance dated Jan. 6, 2014, directed to U.S. Appl. No. 12/774,495; 8 pages.
Masuda et al., U.S. Office Action dated Oct. 16, 2008, directed to U.S. Appl. No. 11/497,663; 11 pages.
Masuda et al., U.S. Office Action dated May 27, 2009, directed to U.S. Appl. No. 11/497,663; 12 pages.
Masuda et al., U.S. Office Action dated Oct. 21, 2009, directed to U.S. Appl. No. 11/497,663; 13 pages.
Masuda et al., U.S. Office Action dated Mar. 12, 2010, directed to U.S. Appl. No. 11/497,663; 12 pages.
Masuda et al., U.S. Office Action dated Jan. 28, 2009, directed to U.S. Appl. No. 11/515,512; 32 pages.
Masuda et al., U.S. Office Action dated Jul. 7, 2009, directed to U.S. Appl. No. 11/515,512; 19 pages.
Masuda et al., U.S. Office Action dated Feb. 17, 2010, directed to U.S. Appl. No. 11/515,512; 21 pages.
Masuda et al., U.S. Office Action dated Jul. 2, 2010, directed to U.S. Appl. No. 11/515,512; 22 pages.
Masuda et al., U.S. Office Action dated Nov. 24, 2010, directed to U.S. Appl. No. 11/515,512; 23 pages.
Masuda et al., U.S. Advisory Action dated Mar. 16, 2011, directed to U.S. Appl. No. 11/515,512; 5 pages.
Masuda et al., U.S. Office Action dated May 6, 2011, directed to U.S. Appl. No. 11/515,512; 19 pages.
Masuda et al., U.S. Office Action dated Oct. 21, 2011, directed to U.S. Appl. No. 11/515,512; 42 pages.
Masuda et al., U.S. Office Action dated Feb. 22, 2012, directed to U.S. Appl. No. 11/515,512; 35 pages.
Masuda et al., U.S. Office Action dated Nov. 15, 2010, directed to U.S. Appl. No. 11/944,052; 12 pages.
Masuda et al., U.S. Office Action dated Apr. 28, 2011, directed to U.S. Appl. No. 11/944,052; 8 pages.
Masuda et al., U.S. Office Action dated Aug. 9, 2011, directed to U.S. Appl. No. 11/944,052; 3 pages.
Masuda et al., U.S. Office Action dated Apr. 5, 2013, directed to U.S. Appl. No. 11/944,052; 26 pages.
Masuda et al., Notice of Allowance dated Oct. 17, 2013, directed to U.S. Appl. No. 11/944,052; 11 pages.
Masuda, M. et al., U.S. Office Action dated Jul. 30, 2013, directed to U.S. Appl. No. 13/729,191; 7 pages.
Masuda et al., U.S. Office Action dated Mar. 17, 2010, directed to U.S. Appl. No. 12/171,946; 7 pages.
Masuda et al., Notice of Allowance dated Nov. 19, 2013, directed to U.S. Appl. No. 13/303,907; 18 pages.
Masuda et al., Notice of Allowance dated Dec. 13, 2013, directed to U.S. Appl. No. 13/500,803; 10 pages.
Masuda et al., U.S. Office Action dated Feb. 3, 2014, directed to U.S. Appl. No. 13/729,191 ; 7 pages.
Masuda et al., U.S. Notice of Allowance dated Mar. 20, 2014, directed to U.S. Appl. No. 13/729,191 ; 7 pages.
Hanamoto et al., U.S. Office Action dated Apr. 17, 2014, directed to U.S. Appl. No. 13/263,053; 9 pages.

* cited by examiner

PHOSPHOR, METHOD OF PRODUCING THE SAME, AND LIGHT EMITTING APPARATUS

CROSS-REFERENCE TO RELATED APPLICATIONS

This application is a divisional of U.S. application Ser. No. 15/371,747, filed Dec. 7, 2016, which is a continuation of U.S. application Ser. No. 14/166,231, filed Jan. 28, 2014, which is a divisional of U.S. application Ser. No. 11/944,052, filed Nov. 21, 2007, which claims priority under 35 U.S.C. § 119(a) to Japanese Patent Application No. 2006-317524 filed with the Japan Patent Office on Nov. 24, 2006, the entire contents of which are hereby incorporated by reference.

BACKGROUND OF THE INVENTION

Field of the Invention

The present invention mainly relates to oxynitride phosphors and nitride phosphors used for a light emitting apparatus, and methods of producing the same, and further to a light emitting apparatus having a light converter using the above phosphor.

Description of the Background Art

A light emitting apparatus having a combination of a semiconductor light emitting device and a phosphor attracts attention as a next-generation light emitting apparatus for which low power consumption, compact size, high intensity and high color gamut are expected, and research and development thereof is actively proceeded. As primary light that is emitted from a light emitting device, usually light from ultraviolet to blue range, more specifically from 380 nm to 480 nm is used. Also, light converters adapted to this application using various phosphors have been proposed.

Also in recent years, an attempt is made for the light emitting apparatus of this type to realize higher brightness by increasing not only luminous efficiency (brightness) but also input energy. When input energy is increased, it is necessary to effectively dissipate the heat of the entire light emitting apparatus including the light converter. For achieving this, development of the entire structure and material of light emitting apparatus has been proceeded, however, temperature rise in a light emitting device and light converter during operation is still inevitable.

Currently, as a light emitting apparatus exhibiting white light, mainly used is the combination of a light emitting device that emits blue light (peak wavelength: around 450 nm) and a trivalent cerium-activated $(Y, Gd)_3(Al, Ga)_5O_{12}$ phosphor or a divalent europium-activated $(Sr, Ba, Ca)_2SiO_4$ phosphor that is excited by the above blue light and exhibits yellow light emission.

However, in the trivalent cerium-activated $(Y, Gd)_3(Al, Ga)_5O_{12}$ phosphor, in particular, there is a technical problem that it is impossible to set input energy at high states because the luminance at 100° C. decreases to about 85%, compared to the luminance (brightness) of 100% at 25° C. Therefore, an oxynitride phosphor or a nitride phosphor having excellent temperature characteristics attracts attention and active development has been made.

However, in such an oxynitride phosphor or nitride phosphor, reflectance in the visible region is not sufficiently high despite the excellent characteristics, so that there is a technical problem that it absorbs light emitted from the phosphor itself or the light emitted from other phosphor. Therefore, in such an oxynitride phosphor or nitride phosphor, improvement in reflectance is urgently needed.

As to such an oxynitride phosphor or nitride phosphor, for example, Japanese Laid-Open Patent Publication No. 2002-363554 (Patent document 1) describes α-type SiAlON(SIALON). Specifically, Patent document 1 describes Ca-α-SiAlON phosphor activated with varying amounts of $Eu^{2+}$ ion as a representative oxynitride phosphor or nitride phosphor. However. Patent document 1 lacks description about reflectance in the visible region of phosphor.

In Japanese Laid-Open Patent Publication No. 2006-089547 (Patent document 2), β-SiAlON: Eu which is a green phosphor and Ca-α-SiAlON: Eu which is an yellow phosphor are described. However, Patent document 2 also lacks description about the reflectance of phosphor in the visible region.

Furthermore, Japanese Laid-Open Patent Publication No. 2004-182780 (Patent document 3) describes a nitride phosphor that emits light of yellow to red regions represented by $L_xM_yN_{(2/3)x+(4/3)y}$:R or $L_xM_yO_zN_{((2/3)x+(4/3)y-(2/3)z)}$:R. However, even in Patent document 3, there is no description about the reflectance of phosphor in the visible region.

Japanese Laid-Open Patent Publication No. 10-228868 (Patent document 4) describes provision of a reflection-preventing film of silicon oxide or the like, on phosphor particles of europium-doped yttrium oxide, manganese-doped zinc silicate, europium-doped barium-magnesium-aluminum oxide or the like. However, Patent document 4 fails to describe reflectance of the phosphor itself.

Japanese Laid-Open Patent Publication No. 2004-155907 (Patent document 5) discloses an invention relating to a manganese-activated aluminate phosphor having green body color, which is excited by vacuum UV beam and emits green light having a peak wavelength of about 515 nm. A spectral reflectance in a vicinity of the peak wavelength or lower is improved to reduce absorption of light emitted from the phosphor and excitation light or vacuum UV light and thus increase light emission in luminance. However, the invention does not focus on a reflectance for a wavelength longer than the peak wavelength and does not consider absorption of light emitted from other phosphors, nor does it focus on visible light excitation.

SUMMARY OF THE INVENTION

The present invention was made to solve the aforementioned problems, and it is an object of the present invention to provide a nitride phosphor and an oxynitride phosphor which stably emit light with high efficiency in response to light of 430 to 480 nm from a semiconductor light emitting device, a method of producing these phosphors, and a light emitting apparatus realizing high efficiency and stable characteristics.

In order to achieve the above object, present inventors repeatedly made detailed examination, tests and study about improvement in reflectance in the visible region in specific divalent europium-activated nitride and oxynitride phosphors, and finally found that nitride and oxynitride phosphors having significantly improved reflectance in the visible region can be obtained by optimizing materials and synthetic processes of the phosphors. Specifically, the present invention is as follows.

The present invention provides a divalent europium-activated oxynitride phosphor which is β-type SiAlON substantially represented by General formula (A):

$Eu_aSi_bAl_cO_dN_e$, wherein reflectance of light emission in a longer wavelength region of visible light than a peak wavelength is 95% or larger. In the above General formula (A), $0.005 \le a \le 0.4$, $b+c=12$, and $d+e=16$ are satisfied.

The present invention provides a divalent europium-activated oxynitride phosphor which is α-type SiAlON substantially represented by General formula (B): $MI_fEu_gSi_hAl_kO_mN_n$, wherein reflectance of light emission in a longer wavelength region of visible light than a peak wavelength is 95% or larger. In the above General formula (B), MI represents at least one kind of element selected from Li, Na, K, Cs, Mg, Ca, Sr and Ba, and $0<f \le 3.0$, $0.005 \le g \le 0.4$, $h+k=12$, and $m+n=16$ are satisfied. Here, MI in the above General formula (B) is preferably at least one kind of element selected from Li and Ca.

Also, the present invention provides a divalent europium-activated nitride phosphor substantially represented by General formula (C): $(MII_{1-p}Eu_p)MIIISiN_3$, wherein reflectance of light emission in a longer wavelength region of visible light than a peak wavelength is 95% or larger. In the above General formula (C), MII is an alkaline earth metal element and represents at least one kind of element selected from Mg, Ca, Sr and Ba, and MIII comprises a trivalent metal element, and represents at least one kind of element selected from Al, Ga, In, Sc, Y, La, Gd and Lu, and $0.001 \le p \le 0.05$ is satisfied. Here, MIII in the above General formula (C) is preferably at least one kind of element selected from Al, Ga and In.

The present invention provides a method of producing a phosphor according to the present invention as described above, and also provides a method of producing a phosphor which includes mixing aluminum nitride covered with fine particle silicon dioxide into materials for the phosphor.

Here, it is preferred that silicon dioxide for covering aluminum nitride has an average particle diameter of 10 to 200 nm, and occupies 0.01 to 15% by weight relative to aluminum nitride.

In the method of producing a phosphor according to the present invention, preferably, the materials for phosphor are mixed in an inert atmosphere without using an apparatus for mechanical grinding.

The present invention also provides a light emitting apparatus including a light emitting device that emits primary light, and a light converter that absorbs part of the primary light and emits secondary light having a longer wavelength than that of the primary light, wherein the light converter includes at least one selected from a green-based luminous phosphor, an yellow-based luminous phosphor and a red-based luminous phosphor, and the green-based luminous phosphor is a divalent europium-activated oxynitride phosphor which is β-type SiAlON substantially represented by General formula (A): $Eu_aSi_bAl_cO_dN_e$, wherein reflectance of light emission in a longer wavelength region of visible light than a peak wavelength is 95% or larger; the yellow-based luminous phosphor is a divalent europium-activated oxynitride phosphor which is α-type SiAlON substantially represented by General formula (B): $MI_fEu_gSi_hAl_kO_mN_n$, wherein reflectance of light emission in a longer wavelength region of visible light than a peak wavelength is 95% or larger, and the red-based luminous phosphor is a divalent europium-activated nitride phosphor which is substantially represented by General formula (C): $(MII_{1-p}Eu_p)MIIISiN_3$, wherein reflectance of light emission in a longer wavelength region of visible light than a peak wavelength is 95% or larger. In the above General formula (A), $0.005 \le a \le 0.4$, $b+c=12$, and $d+e=16$ are satisfied; in the above General formula (B), MI represents at least one kind of element selected from Li, Na, K, Cs, Mg, Ca, Sr and Ba, and $0<f \le 3.0$, $0.005 \le g \le 0.4$, $h+k=12$, and $m+n=16$ are satisfied; and in the above General formula (C), MII is an alkaline earth metal element and represents at least one kind of element selected from Mg, Ca, Sr and Ba, and MIII comprises a trivalent metal element, and represents at least one kind of element selected from Al, Ga, In, Sc, Y, La, Gd and Lu, and $0.001 \le p \le 0.05$ is satisfied.

In the light emitting apparatus according to the present invention, it is preferable to use as the yellow-based luminous phosphor, a divalent europium-activated oxynitride phosphor in which MI in General formula (B) is at least one kind of element selected from Li and Ca.

In the light emitting apparatus according to the present invention, it is preferable to use as the red-based luminous phosphor, a divalent europium-activated nitride phosphor in which MIII in General formula (C) is at least one kind of element selected from Al, Ga and In.

In the light emitting apparatus according to the present invention, it is preferable that the light emitting device is a gallium nitride-based semiconductor device, and primary light from the light emitting device has a wavelength ranging from 430 to 480 nm.

The phosphor according to the present invention as described above stably emits light with high efficiency by the light ranging from 430 to 480 nm, and the light emitting apparatus using a light converter having the phosphor according to the present invention is able to absorb light emitted from the light emitting device with high efficiency and offers stable white light with high efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
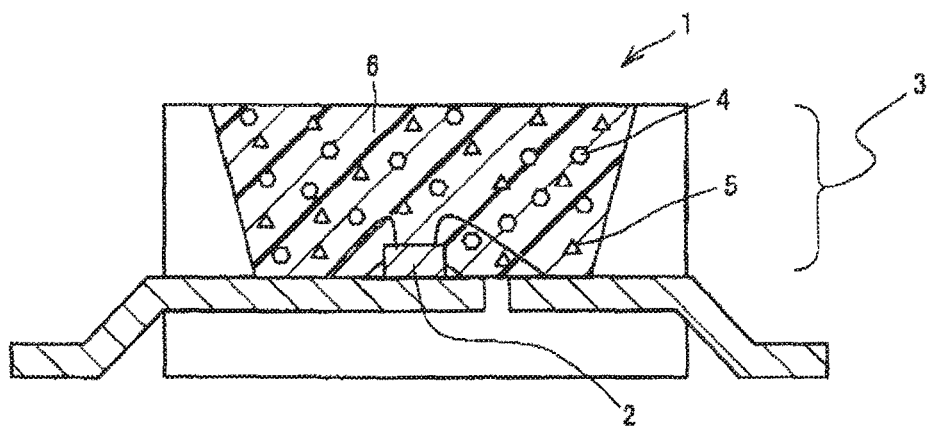
FIG. 1 is a sectional view schematically showing a light emitting apparatus 1 which is one preferred example of the present invention.

The present invention provides [1] a divalent europium-activated oxynitride phosphor which is β-type SiAlON (hereinafter, referred to as "first phosphor"), [2] a divalent europium-activated oxynitride phosphor which is α-type SiAlON (hereinafter, referred to as "second phosphor"), and [3] a divalent europium-activated nitride phosphor (hereinafter, referred to as "third phosphor"). In the following, detailed description will be given for each phosphor.

[1] First Phosphor

The first phosphor according to the present invention is a divalent europium-activated oxynitride phosphor which is β-type SiAlON(SIALON) substantially represented by the following General formula (A).

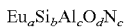

General formula (A):

In the above General formula (A), "a" is a value satisfying $0.005 \le a \le 0.4$, preferably $0.01 \le a \le 0.2$. When the value of "a" is less than 0.005, a problem arises that sufficient brightness is not obtained, whereas when the value of "a" is more than 0.4, a problem arises that brightness largely drops due to concentration quenching or the like. In the above General formula (A), b+c=12, and d+e=16 are satisfied.

Concrete examples of such a divalent europium-activated oxynitride phosphor which is β-type SiAlON include, but are obviously not limited to, $Eu_{0.03}Si_{11.63}Al_{0.37}O_{0.03}N_{15.97}$, $Eu_{0.05}Si_{11.50}Al_{0.50}O_{0.05}N_{15.95}$, $Eu_{0.10}Si_{11.01}Al_{0.99}O_{0.20}N_{15.80}$, $Eu_{0.30}Si_{9.80}Al_{2.20}O_{0.30}N_{15.70}$, $Eu_{0.005}Si_{11.70}Al_{0.30}O_{0.03}N_{15.97}$, $Eu_{0.01}Si_{11.60}Al_{0.40}O_{0.01}N_{15.99}$, $Eu_{0.15}Si_{10.00}Al_{2.00}O_{0.20}N_{15.80}$ and so on.

In the first phosphor according to the present invention, reflectance of light emission in a longer wavelength region of visible light than a peak wavelength is 95% or larger (preferably 97% or larger). When reflectance of light emission in a longer wavelength region of visible light than the peak wavelength is less than 95%, output of white-based color drawn outside significantly decreases because visible light emitted from the phosphor is absorbed. The reflectance is calculated by (100−absorptance) from absorptance in a longer wavelength region of visible light than the peak wavelength that is measured, for example, by MCPD7000 manufactured by OTSUKA ELECTRONICS CO., LTD.

As to the first phosphor according to the present invention, its particle diameter is not particularly limited, however, an average particle diameter measured by Blaine method falls preferably in the range of 2 to 8 μm, and more preferably in the range of 3 to 6 μm. When the average particle diameter of the first phosphor is less than 2 μm, crystal growth is insufficient, and brightness in a light emitting apparatus using the same tends to greatly decrease. On the other hand, when the average particle diameter of the first phosphor is larger than 8 μm, bulk particles that have grown abnormally are likely to be generated, so that the practicability is poor.

[2] Second Phosphor

The second phosphor according to the present invention is a divalent europium-activated oxynitride phosphor which is α-type SiAlON substantially represented by the following General formula (B).

$$MI_fEu_gSi_hAl_kO_mN_n \qquad \text{General formula (B):}$$

In the above General formula (B). MI represents at least one kind of element selected from Li, Na, K, Cs, Mg, Ca, Sr and Ba. Among these, it is more preferred that MI is at least one kind selected from Li and Ca because a light emitting apparatus that emits brighter light is obtained.

In the above General formula (B), the value of "f" satisfies 0<f≤3.0, and more preferably 0.1≤f≤2.0. When the value of "f" is 0 (that is, MI is not contained), and when the value of "f" is more than 3.0, it is impossible to achieve stable solid solution in a lattice, so that a trouble arises that sufficient brightness is not obtained.

In the above General formula (B), the value of "g" satisfies 0.005≤g≤0.4, and preferably 0.02≤g≤0.2. When the value of "g" is less than 0.005, a trouble arises that sufficient brightness is not obtained, while when the value of "g" is more than 0.4, a trouble that brightness significantly decreases due to concentration quenching or the like arises.

In the above General formula (B), h+k=12, and m+n=16 are satisfied.

Concrete examples of the divalent europium-activated oxynitride phosphor which is α-type SiAlON as described above include, but are obviously not limited to, $Ca_{0.6}Eu_{0.05}Si_{10.52}Al_{1.48}O_{0.88}N_{15.12}$, $Ca_{0.2}Eu_{0.01}Si_{10.10}Al_{1.90}O_{0.80}N_{15.20}$, $Ca_{1.0}Eu_{0.06}Si_{10.72}Al_{1.28}O_{1.38}N_{14.62}$, $Ca_{0.3}Eu_{0.10}Si_{10.20}Al_{1.80}O_{0.40}N_{15.60}$, $Ca_{0.4}Mg_{0.1}Eu_{0.03}Si_{10.00}Al_{2.00}O_{1.10}N_{14.90}$, $Ca_{0.75}Eu_{0.01}Si_{9.75}Al_{2.25}O_{0.76}N_{15.24}$, $Ca_{0.50}Li_{0.10}Eu_{0.01}Si_{11.50}Al_{0.50}O_{0.20}N_{15.80}$, and $Ca_{1.10}Sr_{0.10}Eu_{0.20}Si_{10.00}Al_{2.00}O_{0.30}N_{15.70}$.

In the second phosphor according to the present invention, reflectance of light emission in a longer wavelength region of visible light than a peak wavelength is 95% or larger (preferably 97% or larger) for the same reason as previously described in relation to the first phosphor according to the present invention. The reflectance of light emission in a longer wavelength region of visible light than a peak wavelength in the second phosphor according to the present invention also represents the value measured in the same manner as described for the case of the first phosphor according to the present invention.

As to the second phosphor according to the present invention, its particle diameter is not particularly limited, however, the average particle diameter measured by Blaine method falls preferably in the range of 2 to 8 μm, and more preferably in the range of 3 to 6 μm. When the average particle diameter of the second phosphor is less than 2 μm, crystal growth is insufficient, and brightness in a light emitting apparatus using the same tends to greatly decrease. On the other hand, when the average particle diameter of the second phosphor is larger than 8 μm, bulk particles that have grown abnormally are likely to be generated, so that the practicability is poor.

[3] Third Phosphor

The third phosphor according to the present invention is a divalent europium-activated nitride phosphor which is substantially represented by the following General formula (C).

$$(MII_{1-p}Eu_p)MIISiN_3 \qquad \text{General formula (C):}$$

In the above General formula (C), MII is an alkaline earth metal, and represents at least one kind of element selected from Mg, Ca, Sr and Ba.

In General formula (C), MII is a trivalent metal element, and represents at least one kind of element selected from Al, Ga, In, Sc, Y, La, Gd and Lu. Among these, MIII is preferably at least one kind of element selected from Al, Ga and In because more efficient emission of red-based light is possible.

In the above General formula (C), the value of "p" satisfies 0.001≤p≤0.05, and preferably 0.005≤p≤0.02. When the value of "p" is less than 0.001, a trouble that sufficient brightness is not obtained arises, while when the value of "p" is more than 0.05, a trouble that brightness significantly decreases due to concentration quenching or the like arises.

Concrete examples of such a divalent europium-activated nitride phosphor include, but are obviously not limited to, $Ca_{0.990}Eu_{0.010}SiAlN_3$, $(Ca_{0.97}Mg_{0.02}Eu_{0.01})(Al_{0.99}Ga_{0.01})SiN_3$, $(Ca_{0.98}Eu_{0.02})AlSiN_3$, $(Ca_{0.97}Sr_{0.01}Eu_{0.02})(Al_{0.98}In_{0.02})SiN_3$, $(Ca_{0.999}Eu_{0.001})AlSiN_3$, $(Ca_{0.895}Mg_{0.100}Eu_{0.005})AlSiN_3$, $(Ca_{0.79}Sr_{0.20}Eu_{0.01})AlSiN_3$, and $(Ca_{0.98}Eu_{0.02})Al_{0.95}Ga_{0.05})SiN_3$.

In the third phosphor according to the present invention, reflectance of light emission in a longer wavelength region of visible light than a peak wavelength is 95% or larger (preferably 97% or larger) for the same reason as previously described in relation to the first phosphor according to the present invention. The reflectance of light emission in a longer wavelength region of visible light than a peak wavelength in the third phosphor according to the present invention is also determined in the same manner as described for the case of the first phosphor according to the present invention.

As to the third phosphor according to the present invention, its particle diameter is not particularly limited, however, the average particle diameter measured by Blaine method falls preferably in the range of 3 to 10 μm, and more preferably in the range of 4 to 7 μm. When the average particle diameter of the third phosphor is less than 3 μm, crystal growth is insufficient, and brightness in a light emitting apparatus using the same tends to greatly decrease. On the other hand, when the average particle diameter of the third phosphor is larger than 10 μm, bulk particles that have grown abnormally are likely to be generated, so that the practicability is poor.

Production methods of the first to third phosphors according to the present invention as described above are not particularly limited insofar as they are produced so that they have the aforementioned reflectances of light emission in a longer wavelength region of visible light than a peak wavelength, respectively. In the present invention, also provided is a method capable of suitably producing the first to third phosphors according to the present invention as described above. That is, the present method of producing a phosphor is characterized by mixing aluminum nitride (AlN) covered with fine particle silicon dioxide ($SiO_2$) into materials for the phosphor.

Fine particle silicon dioxide covering aluminum nitride used in the method of producing a phosphor according to the present invention has an average particle diameter preferably ranging from 10 to 200 nm, and more preferably ranging from 20 to 80 nm. When the average particle diameter of silicon dioxide is less than 10 nm, it could be impossible to form a uniform covering layer, and when the average particle diameter of silicon dioxide is more than 200 nm, it could be impossible to keep the chemical stability of aluminum nitride covered with the same. The average particle diameter of silicon dioxide may be determined by measuring specific surface area by using an appropriate apparatus known in the art, and determining an average particle diameter on the assumption that the particle is spherical, or may be calculated from its image using an SEM.

Covering amount by silicon dioxide is preferably in the range of 0.01 to 15% by weight, and more preferably in the range of 0.1 to 5% by weight relative to aluminum nitride. When the covering amount by silicon dioxide is less than 0.01% by weight relative to aluminum nitride, it tends to become difficult to form a uniform covering layer, and when the covering amount by silicon dioxide is more than 15% by weight relative to aluminum nitride, brightness of the phosphor tends to decrease significantly. The covering amount of silicon dioxide may be determined by quantitative analysis using, for example, ICP (inductively-coupled high-frequency plasma) spectrometry.

In the method of producing a phosphor according to the present invention, materials for the phosphor may be mixed by using an apparatus for mechanical grinding such as a vibration mill, however, from the viewpoint of realizing stable mixing of materials for the phosphor while keeping chemical stability of aluminum nitride, and preventing oxidization of materials for a phosphor such as $Si_3N_4$, it is preferred to mix the materials for the phosphor in an inert atmosphere without using such an apparatus for mechanical grinding. As the inert atmosphere, nitrogen, argon and the like atmosphere may be used without any limitation.

Figure 2:
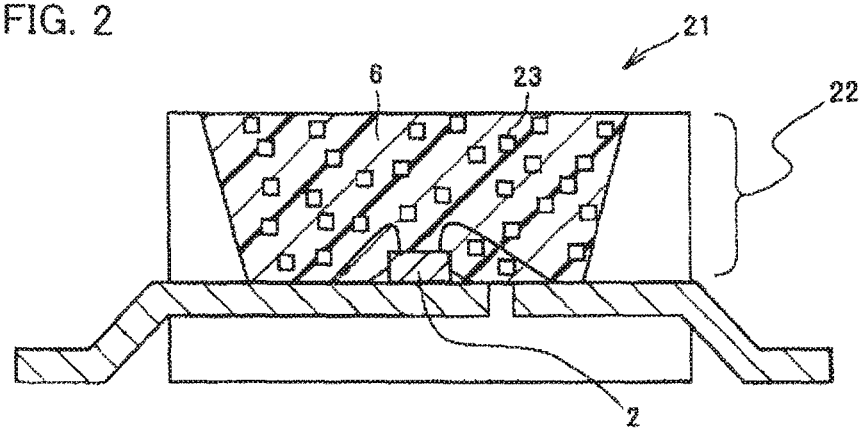
FIG. 2 is a sectional view schematically showing a light emitting apparatus 21 which is other preferred example of the present invention.

The present invention also provides light emitting apparatuses using the first to third phosphors according to the present invention as described above. To be more specific, a light emitting apparatus according to the present invention basically has a light emitting device that emits primary light, and a light converter that absorbs part of the primary light and emits secondary light having a wavelength longer than that of the primary light, and the light converter includes at least one of first to third phosphors: the aforementioned first phosphor as a green-based luminous phosphor, the aforementioned second phosphor as an yellow-based luminous phosphor, and the aforementioned third phosphor as a red-based luminous phosphor. Here, FIG. 1 is a sectional view schematically showing a light emitting apparatus 1 which is one preferred example of the present invention. FIG. 2 is a sectional view schematically showing a light emitting apparatus 21 which is another preferred example of the present invention. Light emitting device 1 which is the example shown in FIG. 1 basically has a light emitting device 2 and a light converter 3, and light converter 3 includes the aforementioned first phosphor as a green-based luminous phosphor 4, and the aforementioned third phosphor as a red-based luminous phosphor 5. Light emitting device 21 which is the example shown in FIG. 2 basically has a light emitting device 2 and a light converter 22, and light converter 22 includes the aforementioned second phosphor as an yellow-based luminous phosphor 23. As described above, a light emitting apparatus according to the present invention is preferably realized so that the light converter includes (1) a green-based luminous phosphor (the aforementioned first phosphor) and a red-based luminous phosphor (the aforementioned third phosphor) (example shown in FIG. 1) or (2) an yellow-based luminous phosphor (second phosphor) (example shown in FIG. 2).

All of the first to third phosphors used in light emitting apparatuses 1, 21 according to the present invention have a reflectance of light emission in a longer wavelength region of visible light than a peak wavelength of 95% or larger (preferably 97% or larger). Such a phosphor stably emits light with high efficiency by light ranging from 430 to 480 nm, and hence, in light emitting apparatuses 1, 21 according to the present invention using such first to third phosphors, it is possible to obtain stable white light with high efficiency as a result of efficient absorption of light from light emitting device 2.

Further, since the first to third phosphors according to the present invention used in light emitting apparatuses 1, 21 according to the present invention are ceramic materials which are high in heat resistance and small in coefficient of heat expansion, variation in band gap is small. In light emitting apparatuses 1, 21 according to the present invention, by using such first to third phosphors, advantageously a light emitting apparatus in which decrease in efficiency of fluorescent emission with respect to temperature is small and temperature characteristics are dramatically improved compared to conventional one can be realized.

In light emitting apparatus 1 of the example shown in FIG. 1, since the phosphor according to the present invention used as green-based luminous phosphor 4 has narrow half width of the emission spectrum, the aforementioned temperature characteristic is excellent, and color gamut (NTSC ratio) is excellent. Therefore, such light emitting apparatus 1 according to the present invention efficiently absorbs light emitted from light emitting device 2 and emits white light with high efficiency, offers excellent white color with very good color gamut (NTSC ratio), and offers white color having an excellent general color rendering index (Ra), so that it is desirable for generic illumination. As described above, light emitting apparatus 1 according to the present invention is preferably realized as a white LED, and among others, use as a light source for backlighting of an LCD is particularly suitable.

In light emitting apparatus 21 of the example shown in FIG. 2, as to yellow-based luminous phosphor (second phosphor of the present invention) 23 contained in light converter 22, MI in General formula (B) is preferably at least one kind of element selected from Li and Ca for the same reason as described above.

In light emitting apparatus 1 of the example shown in FIG. 1, as to red-based luminous phosphor (third phosphor of the present invention) 5 contained in light converter 3, MIII in General formula (C) is preferably at least one kind of element selected from Al, Ga and In.

In light emitting apparatus 1 according to the present invention which is the example shown in FIG. 1, light converter 3 can be produced by kneading a green-based luminous phosphor and a red-based luminous phosphor while using, e.g., a thermosetting-type silicone sealing member as a medium, and molding by sealing light emitting device 2. Blending ratio between the green-based luminous phosphor and the red-based luminous phosphor is not particularly limited, however, for obtaining white light of desired chromaticity, the case of producing a light converter is exemplified wherein the green-based luminous phosphor is 1/10 of medium by weight ratio, and the red-based luminous phosphor is 1/50 of medium by weight ratio.

Light converters 3, 22 in light emitting apparatuses 1, 21 according to the present invention contain at least any one selected from green-based luminous phosphor 4, yellow-based luminous phosphor 23 and red-based luminous phosphor 5 as described above, and a medium 6 thereof is not particularly limited insofar as part of the primary light emitted from light emitting device 2 is absorbed and the secondary light having a wavelength longer than that of the primary light is emitted. As medium 6, for example, transparent resins such as epoxy resin, silicone resin and urea resin can be used, without limited thereto.

Of course, light converters may further contain additives such as $SiO_2$, $TiO_2$, $ZrO_2$, $Al_2O_3$, $Y_2O_3$ and the like as appropriate in addition to the aforementioned phosphor and medium as far as the effect of the present invention is not inhibited.

As light emitting device 2 used in light emitting apparatuses 1, 21 according to the present invention, gallium nitride (GaN) semiconductor can be preferably used from the viewpoint of efficiency. From the viewpoint of making light emitting apparatus 1 according to the present invention emit light efficiently, light emitting device 2 used in light emitting apparatuses 1, 21 according to the present invention preferably emits primary light having a peak wavelength ranging from 430 to 480 nm, and more preferably emits primary light having a peak wavelength ranging from 440 to 470 nm. When the peak wavelength of primary light emitted from light emitting device 2 is less than 430 nm, color rendering property is impaired, and thus is impractical. When the peak wavelength is more than 480 nm, brightness in white color decreases, and the practicality tends to be lost.

The light converter in the light emitting apparatus according to the present invention can be produced by dispersing the aforementioned green-based luminous phosphor 4, yellow-based luminous phosphor 23 and red-based luminous phosphor 5 in an appropriate resin, and molding under appropriate conditions, and the producing method is not particularly limited.

In the following, the present invention will be described in more detail by way of examples and comparative examples, however it is to be noted that the present invention is not limited to such examples.

Example 1

191.64 g of silicon nitride ($Si_3N_4$) powder, 6.75 g of aluminum nitride (AlN) powder covered with 2.0% by weight of silicon dioxide ($SiO_2$) having an average particle diameter of 24 nm, and 1.62 g of europium oxide ($Eu_2O_3$) powder were weighed, and introduced into a V-shaped mixer in a glove box the entirety of which is substituted with nitrogen, and mixed for twenty minutes. The obtained mixture was put into a crucible of boron nitride and calcined for eight hours at 2000° C. in nitrogen atmosphere at 10 atm. The obtained calcined substance was ground by a ball mill or the like. The ground powder was put into a crucible of boron nitride, and calcined for ten hours at 1700° C. in nitrogen atmosphere at 5 atm. The obtained calcined substance was ground by a ball mill or the like. After grinding, 1 L of pure water was put into a 1 L-beaker, followed by the calcined substance, and stirred. After stirring for a predetermined time, the stirring was stopped and the reaction was kept still to remove fine particle components that have occurred during the grinding. This cleaning operation was repeated to remove most of the fine particle components. Thereafter, filtration and drying (110° C., 16 hours) were conducted. The obtained phosphor was β-type SiAlON represented by $Eu_{0.03}Si_{11.63}Al_{0.37}O_{0.03}N_{15.97}$.

Comparative Example 1

The method similar to that of Example 1 was conducted except that aluminum nitride (AlN) powder not covered with silicon dioxide ($SiO_2$) was used, and as a mixture of materials, a mixture obtained by adding a higher hydrocarbon solvent represented by $n-C_nH_{2n+2}$ in mixing was used. The obtained phosphor was β-type SiAlON represented by $Eu_{0.03}Si_{11.63}Al_{10.37}O_{0.03}N_{15.97}$.

Example 2

118.60 g of silicon nitride ($Si_3N_4$) powder, 16.46 g of aluminum nitride (AlN) powder covered with 10.0% by weight of silicon dioxide ($SiO_2$) having an average particle diameter of 100 nm, 2.12 g of europium oxide ($Eu_2O_3$) powder, and 14.47 g of calcium carbonate ($CaCO_3$) powder were weighed, introduced into a V-shaped mixer in a glove box the entirety of which is substituted with nitrogen, and mixed for twenty minutes. The obtained mixture was put into a crucible of boron nitride and calcined for twelve hours at 1700° C. in nitrogen atmosphere at 10 atm. The obtained calcined substance was ground by a ball mill or the like. After grinding, 1 L of pure water was put into a 1 L-beaker, followed by the calcined substance, and stirred. After stirring for a predetermined time, the stirring was stopped and the reaction was kept still to remove fine particle components that have occurred during the grinding. This cleaning operation was repeated to remove most of the fine particle components. Thereafter, filtration and drying (110° C., 16 hours) were conducted. The obtained phosphor was α-type SiAlON represented by $Ca_{0.6}Eu_{0.05}Si_{10.52}Al_{1.48}O_{0.88}N_{15.12}$.

Comparative Example 2

α-type SiAlON represented by $Ca_{0.6}Eu_{0.05}Si_{10.50}Al_{1.50}O_{0.70}N_{15.30}$ was obtained in the same manner as in Example 2 except that aluminum nitride (AlN) powder that is not covered with silicon dioxide ($SiO_2$) was used, and a mixture that was mixed by using a ball mill was used as the mixture of materials.

Example 3

56.54 g of calcium nitride ($Ca_3N_2$) powder, 47.38 g of aluminum nitride (AlN) powder covered with 0.1% by weight of silicon dioxide ($SiO_2$) having an average particle diameter of 45 nm, 54.05 g of silicon nitride ($Si_3N_4$) powder, and 2.03 g of europium oxide ($Eu_2O_3$) powder were weighed, and introduced into a V-shaped mixer in a glove box the entirety of which is substituted with nitrogen, and mixed for twenty minutes. The obtained mixture was put into a crucible of boron nitride and calcined for five hours at 1500° C. in nitrogen atmosphere. The obtained calcined substance was ground by a ball mill or the like. After grinding, 1 L. of pure water was put into a 1 L-beaker, followed by the calcined substance, and stirred. After stirring for a predetermined time, the stirring was stopped and the reaction was kept still to remove fine particle components that have occurred during the grinding. This cleaning operation was repeated to remove most of the fine particle components. Thereafter, filtration and drying (110° C., 16 hours) were conducted. The obtained phosphor was a nitride phosphor represented by $Ca_{0.990}Eu_{0.010}SiAlN_3$.

Comparative Example 3

A phosphor was produced in the same manner as in Example 3 except that aluminum nitride (AlN) powder that is not covered with silicon dioxide ($SiO_2$) was used, and a mixture that was mixed by using a ball mill was used as the mixture of materials.

(Evaluation Test 1)

Using the phosphors obtained in Examples 1 to 3, and Comparative examples 1 to 3, absorptance in a longer wavelength region than a peak wavelength was measured with the use of MCPD7000 manufactured by OTSUKA ELECTRONICS CO., LTD., and reflectance was calculated from the absorptance. Phosphors of Example 1 and Comparative example 1 had peak wavelengths around 540 nm, and reflectance in a longer wavelength region than around 540 nm was 97.3% for the phosphor in Example 1, and 85.2% for the phosphor in Comparative example 1. Phosphors of Example 2 and Comparative example 2 had peak wavelengths around 585 nm, and reflectance in a longer wavelength region than around 585 nm was 97.0% for the phosphor in Example 2, and 84.1% for the phosphor in Comparative example 2. Phosphors of Example 3 and Comparative example 3 had peak wavelengths around 645 nm, and reflectance in a longer wavelength region than around 645 nm was 97.6% for the phosphor in Example 3, and 86.0% for the phosphor in Comparative example 3. Reflectances measured for Examples 1 to 3 and Comparative examples 1 to 3 are shown in Table 1

TABLE 1

|  | REFLECTANCE (%) |
| --- | --- |
| EXAMPLE 1 | 97.3 |
| COMPARATIVE EXAMPLE 1 | 85.2 |
| EXAMPLE 2 | 97.0 |
| COMPARATIVE EXAMPLE 2 | 84.1 |
| EXAMPLE 3 | 97.6 |
| COMPARATIVE EXAMPLE 3 | 86.0 |

Table 1 demonstrates that the phosphors according to the present invention exhibit better reflectances in comparison with the conventional ones.

Examples 4 to 14, Comparative Examples 4 to 14

Each phosphor shown in Table 2 was produced in a similar manner as described in Examples 1 to 3 and subjected to an evaluation test. In Table 2, the average particle diameter (nm) and covering amount (% by weight) of silicon dioxide ($SiO_2$) that covers aluminum nitride (AlN) powder are shown together.

TABLE 2

|  | COMPOSITION | SIZE (nm) | COVERING AMOUNT (WT. %) | REFLECTANCE (%) |
| --- | --- | --- | --- | --- |
| EXAMPLE 4 | $Eu_{0.05}Si_{11.50}Al_{0.50}O_{0.05}N_{15.95}$ (β-type SiAlON) | 70 | 5.0 | 97.9 |
| COMPARATIVE EXAMPLE 4 | $Eu_{0.05}Si_{11.50}Al_{0.50}O_{0.05}N_{15.95}$ (β-type SiAlON) | — | — | 84.3 |
| EXAMPLE 5 | $Eu_{0.10}Si_{11.01}Al_{0.99}O_{0.20}N_{15.80}$ (β-type SiAlON) | 15 | 15.0 | 97.7 |
| COMPARATIVE EXAMPLE 5 | $Eu_{0.10}Si_{11.00}Al_{1.00}O_{0.10}N_{15.90}$ (β-type SiAlON) | — | — | 84.0 |
| EXAMPLE 6 | $Eu_{0.30}Si_{9.80}Al_{2.20}O_{0.30}N_{15.70}$ (β-type SiAlON) | 200 | 1.0 | 97.0 |
| COMPARATIVE EXAMPLE 6 | $Eu_{0.30}Si_{9.80}Al_{2.20}O_{0.30}N_{15.70}$ (β-type SiAlON) | — | — | 85.3 |
| EXAMPLE 7 | $Ca_{0.2}Eu_{0.01}Si_{10.10}Al_{1.90}O_{0.80}N_{15.20}$ (α-type SiAlON) | 63 | 0.01 | 96.9 |
| COMPARATIVE EXAMPLE 7 | $Ca_{0.2}Eu_{0.01}Si_{10.10}Al_{1.90}O_{0.80}N_{15.20}$ (α-type SiAlON) | — | — | 85.5 |
| EXAMPLE 8 | $Ca_{1.0}Eu_{0.06}Si_{10.72}Al_{1.28}O_{1.38}N_{14.62}$ (α-type SiAlON) | 51 | 8.0 | 97.8 |
| COMPARATIVE EXAMPLE 8 | $Ca_{1.0}Eu_{0.06}Si_{10.70}Al_{1.30}O_{1.20}N_{14.80}$ (α-type SiAlON) | — | — | 84.9 |
| EXAMPLE 9 | $Ca_{0.3}Eu_{0.10}Si_{10.20}Al_{1.80}O_{0.40}N_{15.60}$ (α-type SiAlON) | 33 | 3.0 | 97.5 |

TABLE 2-continued

| | COMPOSITION | SIZE (nm) | COVERING AMOUNT (WT. %) | REFLECTANCE (%) |
|---|---|---|---|---|
| COMPARATIVE EXAMPLE 9 | $Ca_{0.3}Eu_{0.10}Si_{10.20}Al_{1.80}O_{0.40}N_{15.60}$ (α-type SiAlON) | — | — | 85.1 |
| EXAMPLE 10 | $Ca_{0.4}Mg_{0.1}Eu_{0.03}Si_{10.00}Al_{2.00}O_{1.10}N_{14.90}$ (α-type SiAlON) | 85 | 0.5 | 97.8 |
| COMPARATIVE EXAMPLE 10 | $Ca_{0.4}Mg_{0.1}Eu_{0.03}Si_{10.00}Al_{2.00}O_{1.10}N_{14.90}$ (α-type SiAlON) | — | — | 84.8 |
| EXAMPLE 11 | $(Ca_{0.97}Mg_{0.02}Eu_{0.01})(Al_{0.99}Ga_{0.01})SiN_3$ | 12 | 0.3 | 97.9 |
| COMPARATIVE EXAMPLE 11 | $(Ca_{0.97}Mg_{0.02}Eu_{0.01})(Al_{0.99}Ga_{0.01})SiN_3$ | — | — | 85.1 |
| EXAMPLE 12 | $(Ca_{0.98}Eu_{0.02})AlSiN_3$ | 75 | 1.0 | 97.2 |
| COMPARATIVE EXAMPLE 12 | $(Ca_{0.98}Eu_{0.02})AlSiN_3$ | — | — | 84.5 |
| EXAMPLE 13 | $(Ca_{0.97}Sr_{0.01}Eu_{0.02})(Al_{0.98}In_{0.02})SiN_3$ | 39 | 0.6 | 97.5 |
| COMPARATIVE EXAMPLE 13 | $(Ca_{0.97}Sr_{0.01}Eu_{0.02})(Al_{0.98}In_{0.02})SiN_3$ | — | — | 84.9 |
| EXAMPLE 14 | $(Ca_{0.999}Eu_{0.001})AlSiN_3$ | 25 | 0.01 | 97.8 |
| COMPARATIVE EXAMPLE 14 | $(Ca_{0.999}Eu_{0.001})AlSiN_3$ | — | — | 85.0 |

Table 2 demonstrates that the phosphors according to the present invention exhibit better reflectances in comparison with the conventional ones.

Example 15

As a light emitting device, gallium nitride (GaN) semiconductor having a peak wavelength at 440 nm was used. As a light converter, the one having composition $Ca_{0.6}Eu_{0.05}Si_{10.52}Al_{1.48}O_{0.88}N_{15.12}$ (α-type SiAlON)(Example 2) having a peak wavelength around 585 nm and reflectance in a longer wavelength region than around 585 nm of 97.0% was used as an yellow-based luminous phosphor. This phosphor was dispersed in a predetermined silicone resin to form a light converter, and a light emitting apparatus was produced.

Comparative Example 15

A light emitting apparatus was produced in a similar manner as in Example 15 except that an yellow-based luminous phosphor which has reflectance in a longer wavelength region than around 585 nm of 84.1% and is represented by $Ca_{0.6}Eu_{0.05}Si_{10.50}Al_{1.50}O_{0.70}N_{15.30}$ (α-type SiAlON)(Comparative example 2) was used as the light converter.

(Evaluation Test 2)

The light emitting apparatuses produced in Example 15, and Comparative example 15 were operated with a forward current of 20 mA, and their characteristics (luminosity) were evaluated. The results are shown in Table 3.

TABLE 3

| | Tc-duv | BRIGHTNESS (RELATIVE VALUE) |
|---|---|---|
| EXAMPLE 15 | 3000K + 0.003 | 100.0% |
| COMPARATIVE EXAMPLE 15 | 3000K + 0.003 | 86.7% |

Table 3 demonstrates that the light emitting apparatus according to the present invention exhibits better stability of characteristics, particularly stability in luminance characteristic, in comparison with the conventional one.

Examples 16 to 18, Comparative Examples 16 to 18

A light emitting apparatus was produced in a similar manner as in Example 15 using a combination of light emitting device and phosphor as shown in Table 4, and subjected to an evaluation test.

TABLE 4

| | LIGHT EMTITTENG DEVICE | FLUORESCENT SUBSTANCE | Tc-duv | BRIGHTNESS (RELATIVE VALUE) |
|---|---|---|---|---|
| EXAMPLE 16 | 430 nm | EXAMPLE 7 | 2900K + 0.003 | 100.0% |
| COMPARATIVE EXAMPLE 16 | 430 nm | COMPARATIVE EXAMPLE 7 | 2900K + 0.003 | 88.2% |
| EXAMPLE 17 | 470 nm | EXAMPLE 1 + EXAMPLE 11 | 6700K + 0.003 | 100.0% |
| COMPARATIVE EXAMPLE 17 | 470 nm | COMPARATIVE EXAMPLE 1 + COMPARATIVE EXAMPLE 11 | 6700K + 0.003 | 86.7% |
| EXAMPLE 18 | 480 nm | EXAMPLE 5 + EXAMPLE 12 | 8700K + 0.001 | 100.0% |
| COMPARATIVE EXAMPLE 18 | 480 nm | COMPARATIVE EXAMPLE 5 + COMPARATIVE EXAMPLE 12 | 8700K + 0.001 | 86.0% |

Table 4 demonstrates that the light emitting apparatus according to the present invention exhibits better stability of characteristics, particularly stability in luminance characteristic, in comparison with the conventional one.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A phosphor comprising a yellow emitting phosphor having an α-SiAlON crystal structure comprising Eu, Si, Al, O, N, and at least one element selected from the group consisting of Na, K, and Cs,
   wherein the yellow emitting phosphor has a reflectance of 95% or larger in a region of visible light having wavelengths longer than a peak wavelength of the yellow emitting phosphor, and
   wherein the yellow emitting phosphor has an average particle diameter from 2 micrometers to 8 micrometers.

2. A light converter, comprising the phosphor of claim 1.

3. A light emitting apparatus comprising:
   a light emitting device that emits primary light; and
   the light converter of claim 2.

4. The light emitting apparatus according to claim 3, wherein the light emitting device is a gallium nitride-based semiconductor device, and primary light from the light-emitting device has a wavelength ranging from 430 to 480 nm.

5. A liquid crystal display comprising a backlight source comprising the light emitting apparatus of claim 3.

6. A method for producing a yellow emitting phosphor having an α-SiAlON crystal structure, comprising the steps of:
   providing materials for a phosphor, the materials comprising silicon nitride powder, aluminum nitride powder covered with fine particle silicon dioxide, europium oxide powder, and a compound comprising at least one element selected from the group consisting of Li, Na, K, Cs, Mg, Ca, Sr, and Ba;
   creating a mixture by mixing the materials for the phosphor in an inert atmosphere;
   creating a calcined substance by calcining the mixture in an inert atmosphere;
   grinding the calcined substance;
   mixing the ground calcined substance with water;
   cleaning the mixture by removing fine particle components; and
   filtering and drying the cleaned mixture.

7. The method according to claim 6, wherein creating the calcined substance is accomplished in an inert atmosphere at a pressure greater than atmospheric pressure.

8. The method according to claim 6, wherein creating the mixture is accomplished in an inert atmosphere without using a grinding mill.

9. The method according to claim 6, wherein the silicon dioxide covering the aluminum nitride has an average particle diameter of 10 to 200 nm, and occupies 0.01 to 15% by weight relative to aluminum nitride.

* * * * *